US009238755B2

(12) United States Patent
Yokota et al.

(10) Patent No.: US 9,238,755 B2
(45) Date of Patent: Jan. 19, 2016

(54) POLISHING COMPOSITION

(71) Applicant: FUJIMI INCORPORATED, Kiyosu-shi, Aichi (JP)

(72) Inventors: Shuugo Yokota, Kiyosu (JP); Yasuyuki Yamato, Kiyosu (JP); Satoru Yarita, Kiyosu (JP); Tomohiko Akatsuka, Kiyosu (JP); Shuichi Tamada, Kiyosu (JP)

(73) Assignee: FUJIMA INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/359,269

(22) PCT Filed: Nov. 21, 2012

(86) PCT No.: PCT/JP2012/080219
§ 371 (c)(1),
(2) Date: May 19, 2014

(87) PCT Pub. No.: WO2013/077369
PCT Pub. Date: May 30, 2013

(65) Prior Publication Data
US 2014/0322913 A1    Oct. 30, 2014

(30) Foreign Application Priority Data

Nov. 25, 2011   (JP) ................... 2011-258343
Mar. 16, 2012   (JP) ................... 2012-061154

(51) Int. Cl.
C09G 1/02      (2006.01)
H01L 29/16     (2006.01)
H01L 29/20     (2006.01)
B24B 1/00      (2006.01)
H01L 21/306    (2006.01)
B24B 37/04     (2012.01)
C09K 3/14      (2006.01)

(52) U.S. Cl.
CPC ... C09G 1/02 (2013.01); B24B 1/00 (2013.01); B24B 37/044 (2013.01); C09K 3/1409 (2013.01); C09K 3/1463 (2013.01); H01L 21/30625 (2013.01); H01L 29/16 (2013.01); H01L 29/20 (2013.01)

(58) Field of Classification Search
None
See application file for complete search history.

(56) References Cited

U.S. PATENT DOCUMENTS

| | | | | |
|---|---|---|---|---|
| 4,954,141 A * | 9/1990 | Takiyama et al. | ............... | 51/296 |
| 6,022,264 A * | 2/2000 | Cook et al. | ....................... | 451/37 |
| 7,250,085 B2 * | 7/2007 | Abbadie et al. | ................... | 134/2 |
| 7,595,511 B2 * | 9/2009 | Kang | .............. | 257/88 |
| 8,338,302 B2 | 12/2012 | Schwandner et al. | | |
| 8,647,985 B2 * | 2/2014 | Schwandner et al. | ........ | 438/692 |
| 2003/0139122 A1 * | 7/2003 | Lawing | .......... | 451/288 |
| 2004/0214434 A1 * | 10/2004 | Atwater et al. | ............... | 438/689 |
| 2005/0026432 A1 * | 2/2005 | Atwater et al. | ................. | 438/689 |
| 2006/0278614 A1 * | 12/2006 | Wang et al. | ..................... | 216/89 |
| 2006/0288929 A1 * | 12/2006 | Slack et al. | ..................... | 117/89 |
| 2007/0074457 A1 | 4/2007 | Ito et al. | | |
| 2007/0075041 A1 * | 4/2007 | Ishibashi et al. | ................ | 216/88 |
| 2008/0120918 A1 | 5/2008 | Hattori et al. | | |
| 2008/0169534 A1 * | 7/2008 | Dip et al. | ...................... | 257/622 |
| 2008/0200033 A1 | 8/2008 | Takemiya | | |
| 2009/0159845 A1 * | 6/2009 | Ishibashi et al. | ......... | 252/182.33 |
| 2009/0203215 A1 * | 8/2009 | Yoshikawa et al. | ........... | 438/693 |
| 2010/0072515 A1 * | 3/2010 | Park et al. | ..................... | 257/190 |
| 2010/0130012 A1 | 5/2010 | Schwandner et al. | | |
| 2011/0012233 A1 * | 1/2011 | Ishibashi et al. | .............. | 257/615 |
| 2011/0117740 A1 | 5/2011 | Martinez et al. | | |
| 2012/0088344 A1 * | 4/2012 | van Dal | .......... | 438/283 |
| 2012/0164833 A1 | 6/2012 | Ishibashi et al. | | |
| 2012/0276742 A1 * | 11/2012 | Lee et al. | ...................... | 438/693 |
| 2012/0276819 A1 * | 11/2012 | Lee et al. | ........................ | 451/41 |
| 2014/0170852 A1 * | 6/2014 | Noller et al. | .................. | 438/692 |
| 2014/0199841 A1 * | 7/2014 | Noller et al. | .................. | 438/693 |

FOREIGN PATENT DOCUMENTS

| | | | |
|---|---|---|---|
| JP | 63-150155 A | 6/1988 |
| JP | 11-204520 A | 7/1999 |
| JP | 2000-160138 A | 6/2000 |
| JP | 2003-109920 A | 4/2003 |
| JP | 2004-327614 A | 11/2004 |
| JP | 2007-103514 A | 4/2007 |
| JP | 2008-135452 A | 6/2008 |
| JP | 2010-030041 A | 2/2010 |
| JP | 2010-130009 A | 6/2010 |
| JP | 2010-519740 A | 6/2010 |
| JP | 2011-238763 A | 11/2011 |
| WO | WO 2007/029465 A1 | 3/2007 |
| WO | WO 2008/099245 A1 | 8/2008 |

* cited by examiner

Primary Examiner — Allan Olsen
(74) Attorney, Agent, or Firm — Foley & Lardner LLP

(57) ABSTRACT

A polishing composition of the present invention is to be used for polishing an object including a portion containing a high-mobility material and a portion containing a silicon material. The polishing composition comprises an oxidizing agent and abrasive grains having an average primary particle diameter of 40 nm or less. The polishing composition preferably further contains a hydrolysis-suppressing compound that bonds to a surface OH group of the portion containing a silicon material of the object to function to suppress hydrolysis of the portion containing a silicon material. Alternatively, a polishing composition of the present invention contains abrasive grains, an oxidizing agent, and a hydrolysis-suppressing compound. The polishing composition preferably has a neutral pH.

19 Claims, No Drawings

POLISHING COMPOSITION

TECHNICAL FIELD

The present invention relates to a polishing composition to be used for polishing an object including a portion containing a high-mobility material (hereinafter, also referred to as a high-mobility material portion), such as a group IV material and a group III-V compound, and a portion containing a silicon material (hereinafter, also referred to as a silicon material portion), such as silicon oxide. The present invention also relates to a polishing method and substrate production method using the polishing composition.

BACKGROUND ART

High-mobility channel materials, which are capable of improving the carrier mobility of transistors, have been studied as a means of reducing power consumption and improving performance (operating characteristic) of a transistor. Improving the carrier transport property of a channel increases the drain current flowing when the channel is in ON-state, thereby allowing the power supply voltage to be decreased while obtaining a sufficient ON-state current. This combination brings about higher MOSFET performance at low electric power.

Group III-V compounds, such as gallium arsenide (GaAs), group IV materials, such as silicon germanium (SiGe) and germanium (Ge), and graphene, which consists of only carbon (C), have higher electron and hole mobility than that of silicon and an excellent carrier transport property, and are expected to be used as the high-mobility channel material. Particularly, a channel using a group IV material, which is easier in introduction than a group III-V compound, is positively studied. There is as yet no established technique for growing a group III-V compound channel with high crystallinity and controlling the channel to have a desired shape. Also, the group III-V compound channel has no advantage in terms of cost over the channel using a group IV material.

A high-mobility material channel can be formed by polishing an object including a high-mobility material portion and a silicon material portion. In this case, when a polishing composition is used that can polish the high-mobility material portion with higher selectivity over the silicon material portion, the high-mobility material portion can be efficiently polished and removed. Also, since loss of oxide such as silicon oxide is decreased, a withstand voltage between wiring layers is secured. Further, in a subsequent photolithography process, the decreased loss of oxide facilitates focusing of the exposure light, thereby stabilizing the process (see Patent Document 1). However, a polishing composition described in, for example, Patent Document 2 or 3 and conventionally used for polishing a compound semiconductor substrate consisting of only a group IV compound does not, when used for polishing an object including a high-mobility material portion and a silicon material portion, exhibit sufficiently high polishing selectivity for the high-mobility material portion.

PRIOR ART DOCUMENTS

Patent Document 1: Japanese Laid-Open Patent Publication No. 11-204520
Patent Document 2: Japanese Laid-Open Patent Publication No. 2010-130009
Patent Document 3: Japanese National Phase Laid-Open Patent Publication No. 2010-519740

SUMMARY OF THE INVENTION

Problems that the Invention is to Solve

Accordingly, it is an objective of the present invention to provide a polishing composition that can, when used for polishing an object including a high-mobility material portion and a silicon material portion, exhibit high polishing selectivity for the high-mobility material portion and to provide a polishing method and substrate production method using the polishing composition.

Means for Solving the Problems

In order to achieve the above-mentioned objective and in accordance with a first aspect of the present invention, provided is a polishing composition to be used for polishing an object including a high-mobility material portion and a silicon material portion. The polishing composition contains an oxidizing agent and abrasive grains having an average primary particle diameter of 40 nm or less.

The polishing composition preferably further contains a hydrolysis-suppressing compound that bonds to a surface OH group of the silicon material portion to function to suppress hydrolysis of the silicon material portion.

In accordance with a second aspect of the present invention, provided is a polishing composition to be used for polishing an object including a high-mobility material portion and a silicon material portion. The polishing composition contains abrasive grains, an oxidizing agent, and a hydrolysis-suppressing compound that bonds to a surface OH group of the silicon material portion to function to suppress hydrolysis of the silicon material portion.

The polishing compositions of the first and second aspects preferably have a neutral pH.

In accordance with a third aspect of the present invention, provided is a method for polishing an object including a high-mobility material portion and a silicon material portion with the polishing composition of the first or second aspect.

In accordance with a fourth aspect of the present invention, provided is a method for producing a substrate by polishing an object including a high-mobility material portion and a silicon material portion with the polishing composition of the first or second aspect.

Effects of the Invention

The present invention succeeds in providing a polishing composition that can, when used for polishing an object including a high-mobility material portion and a silicon material portion, exhibit high polishing selectivity for the high-mobility material portion, and a polishing method and substrate production method using the polishing composition.

Modes for Carrying out the Invention

A first embodiment of the present invention will be described below.

A polishing composition of the present embodiment is prepared by mixing specific abrasive grains and an oxidizing agent with water. Therefore, the polishing composition contains a specific abrasive grains and an oxidizing agent.

The polishing composition is used for polishing an object including a high-mobility material portion and a silicon material portion, and specifically for the purpose of selectively polishing a high-mobility material portion in an application for polishing the object to produce a substrate. A high-mobility material as referred to herein means a material having higher electron or hole mobility than that of a silicon material. Examples of the high-mobility material include group III-V compounds, such as gallium phosphide (GaP), indium phosphide (InP), gallium arsenide (GaAs), indium arsenide (InAs), and indium antimonide (InSb), and group IV group materials, such as silicon germanium (SiGe) and germanium (Ge). Examples of the silicon material include polysilicon, silicon oxide, and silicon nitride. For example, the silicon material has an electron mobility of 1,600 $cm^2/V \cdot s$ and a hole mobility of 430 $cm^2/V \cdot s$. By contrast, the high-mobility material, that is, indium phosphide has an electron mobility of 5,400 $cm^2/V \cdot s$ and a hole mobility of 200 $cm^2/V \cdot s$, gallium arsenide has an electron mobility of 8,500 $cm^2/V \cdot s$ and a hole mobility of 400 $cm^2/V \cdot s$, indium arsenide has an electron mobility of 40,000 $cm^2/V \cdot s$ and a hole mobility of 500 $cm^2/V \cdot s$; indium antimonide has an electron mobility of 77,000 $cm^2/V \cdot s$ and a hole mobility of 850 $cm^2/V \cdot s$, and germanium has an electron mobility of 3,900 $cm^2/V \cdot s$ and a hole mobility of 1,900 $cm^2/V \cdot s$. The high-mobility material has at least one of electron mobility and hole mobility values significantly higher than that of the silicon material.

(Abrasive Grains)

The abrasive grains contained in the polishing composition have an average primary particle diameter of 40 nm or less. When the abrasive grains having a small average primary particle diameter of 40 nm or less are used, the polishing rate of the silicon material portion with the polishing composition is advantageously much lower than the polishing rate of the high-mobility material portion with the polishing composition as compared with the case where abrasive grains having an average primary particle diameter of more than 40 nm are used. The value of the average primary particle diameter of the abrasive grains can be calculated, for example, based on the specific surface area of the abrasive grains measured by the BET method.

The abrasive grains in the polishing composition may be any of inorganic particles and organic particles. Specific examples of inorganic particles include particles made of a metal oxide, such as silica, alumina, ceria, and titania. Specific examples of organic particles include polymethyl methacrylate (PMMA) particles. Among them, silica particles are preferable, and colloidal silica is particularly preferable.

The content of the abrasive grains in the polishing composition is preferably 20% by mass or less, more preferably 15% by mass or less, and still more preferably 10% by mass or less. As the abrasive grain content decreases, the material cost of the polishing composition can be reduced, and additionally, the aggregation of the abrasive grains is less likely to occur.

The average secondary particle diameter of the abrasive grains is preferably 170 nm or less, more preferably 150 nm or less, and still more preferably 120 nm or less. As the average secondary particle diameter of the abrasive grains decreases, a polished surface with fewer scratches is easily obtained by polishing the object with the polishing composition. The value of the average secondary particle diameter of the abrasive grains can be measured, for example, by a laser light scattering method.

(Oxidizing Agent)

Although the type of the oxidizing agent contained in the polishing composition is not particularly limited, the oxidizing agent preferably has a standard electrode potential of 0.3 V or more. When an oxidizing agent having a standard electrode potential of 0.3 V or more is used, the polishing rate of the high-mobility material portion with the polishing composition is advantageously enhanced as compared with when an oxidizing agent having a standard electrode potential of less than 0.3 V is used. Specific examples of an oxidizing agent having a standard electrode potential of 0.3 V or more include hydrogen peroxide, sodium peroxide, barium peroxide, an organic oxidizing agent, ozone water, a silver (II) salt, an iron (III) salt, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, sulfuric acid, persulfuric acid, citric acid, dichloroisocyanuric acid, and salts thereof. Among them, hydrogen peroxide, ammonium persulfate, hypochlorous acid, periodic acid, and sodium dichloroisocyanurate are preferable since the polishing rate of the high-mobility material portion with the polishing composition is greatly enhanced.

The standard electrode potential is represented by the following formula when all chemical species participating in an oxidation reaction are in a normal state:

$$E0 = -\Delta G0/nF = (RT/nF)\ln K$$

where E0 is a standard electrode potential, $\Delta G0$ is standard Gibbs energy change of the oxidation reaction, K is a parallel constant thereof, F is a Faraday constant, T is an absolute temperature, and n is the number of electrons participating in the oxidation reaction. Therefore, since the standard electrode potential fluctuates with a temperature, a standard electrode potential at 25° C. is utilized in the present specification. The standard electrode potential of an aqueous solution system is described in, for example, Handbook of Chemistry (fundamental part) II, revised 4th edition, pp. 464-468 (edited by the Chemical Society of Japan).

The content of the oxidizing agent in the polishing composition is preferably 0.01 mol/L or more, and more preferably 0.1 mol/L or more. As the oxidizing agent content increases, the polishing rate of the high-mobility material portion with the polishing composition is enhanced.

The content of the oxidizing agent in the polishing composition is also preferably 100 mol/L or less, and more preferably 50 mol/L or less. As the oxidizing agent content decreases, the material cost of the polishing composition can be reduced, and additionally, the burden of treating the polishing composition after use in polishing, that is, the burden of waste liquid treatment can be reduced.

(pH Adjusting Agent)

The pH of the polishing composition is preferably neutral. More specifically, the pH is preferably within a range of 5 or more and 9 or less. When the pH is neutral, the polishing rate of the silicon material portion with the polishing composition is advantageously reduced.

A pH adjusting agent may be used to adjust the pH of the polishing composition to a desired value. The pH adjusting agent to be used may be any of an acid and an alkali. The pH adjusting agent may be any of inorganic and organic compounds.

According to the present embodiment, the following advantages are obtained.

Abrasive grains having a small average primary particle diameter of 40 nm or less are used in the polishing composition of the present embodiment in order to reduce the polishing rate of the silicon material portion with the polishing composition. Therefore, the polishing composition has high polishing selectivity for the high-mobility material portion.

When the pH of the polishing composition is neutral, the polishing rate of the silicon material portion with the polishing composition is further reduced, which further improves the polishing selectivity of the polishing composition for the high-mobility material portion.

A second embodiment of the present invention will be described below.

A polishing composition of the second embodiment is prepared by mixing abrasive grains, an oxidizing agent, and a hydrolysis-suppressing compound with water. Therefore, the polishing composition contains abrasive grains, an oxidizing agent, and a hydrolysis-suppressing compound.

Like the polishing composition of the first embodiment, the polishing composition of the second embodiment is used for polishing an object including a portion containing a high-mobility material, such as gallium phosphide, indium phosphide, gallium arsenide, indium arsenide, indium antimonide, silicon germanium, and germanium, and a portion containing a silicon material, such as silicon oxide, and specifically for the purpose of selectively polishing a high-mobility material portion in an application for polishing the object to produce a substrate.

(Abrasive Grains)

The abrasive grains contained in the polishing composition of the second embodiment do not need to have an average primary particle diameter of 40 nm or less. Except for this difference, the abrasive grains are the same as the abrasive grains contained in the polishing composition of the first embodiment.

(Oxidizing Agent)

The oxidizing agent contained in the polishing composition of the second embodiment is the same as the oxidizing agent contained in the polishing composition of the first embodiment.

(Hydrolysis-Suppressing Compound)

The hydrolysis-suppressing compound contained in the polishing composition of the second embodiment bonds to a surface OH group of the silicon material portion to function to suppress the hydrolysis of the silicon material portion. In detail, a hydrogen bond is considered to be formed between a surface OH group of the silicon material portion and an oxygen atom contained in the hydrolysis-suppressing compound. Also, a hydrogen bond is considered to be formed between a surface OH group of the silicon material portion and a nitrogen atom contained in the hydrolysis-suppressing compound. Therefore, when the hydrolysis-suppressing compound is used, the polishing rate of the silicon material portion with the polishing composition is advantageously reduced. In light of the mechanism mentioned above, the hydrolysis-suppressing compound is preferably a compound having an oxygen atom or a compound having a nitrogen atom. Specific examples of the hydrolysis-suppressing compound having an oxygen atom include alcohols, such as 1-propanol, 2-propanol, 2-propyn-1-ol, allyl alcohol, ethylene cyanohydrin, 1-butanol, 2-butanol, (S)-(+)-2-butanol, 2-methyl-1-propanol, t-butyl alcohol, perfluoro-t-butyl alcohol, crotyl alcohol, 1-pentanol, 2,2-dimethyl-1-propanol, 2-methyl-2-butanol, 3-methyl-1-butanol, S-amyl alcohol, 1-hexanol, 4-hydroxy-4-methyl-2-pentanone, 4-methyl-2-pentanol, cyclohexanol, DL-3-hexyl alcohol, 1-heptanol, 2-ethyl hexyl alcohol, (S)-(+)-2-octanol, 1-octanol, DL-3-octyl alcohol, 2-hydroxybenzyl alcohol, 2-nitrobenzyl alcohol, 3,5-dihydroxybenzyl alcohol, 3,5-dinitrobenzyl alcohol, 3-fluorobenzyl alcohol, 3-hydroxybenzyl alcohol, 4-fluorobenzyl alcohol, 4-hydroxybenzyl alcohol, benzyl alcohol, m-(trifluoromethyl) benzyl alcohol, m-aminobenzyl alcohol, m-nitrobenzyl alcohol, o-aminobenzyl alcohol, o-hydroxybenzyl alcohol, p-hydroxybenzyl alcohol, p-nitrobenzyl alcohol, 2-(p-fluorophenyl)ethanol, 2-aminophenethyl alcohol, 2-methoxybenzyl alcohol, 2-methyl-3-nitrobenzyl alcohol, 2-methyl benzyl alcohol, 2-nitrophenethyl alcohol, 2-phenyl ethanol, 3,4-dimethyl benzyl alcohol, 3-methyl-2-nitrobenzyl alcohol, 3-methyl-4-nitrobenzyl alcohol, 3-methyl benzyl alcohol, 4-fluorophenethyl alcohol, 4-hydroxy-3-methoxybenzyl alcohol, 4-methoxybenzyl alcohol, 4-methyl-3-nitrobenzyl alcohol, 5-methyl-2-nitrobenzyl alcohol, DL-α-hydroxyethyl benzene, o-(trifluoromethyl)benzyl alcohol, p-(trifluoromethyl)benzyl alcohol, p-aminophenethyl alcohol, p-hydroxyphenyl ethanol, p-methylbenzyl alcohol, S-phenethyl alcohol, and acetyleneglycol; phenols, such as 4-methylphenol, 4-ethylphenol, and 4-propylphenol; glycols, such as ethylene glycol, propylene glycol, caprylyl glycol, butylene glycol, and acetylenediol; glucamines, such as n-decanol-n-methyl-D-glucamine, n-octanoyl-n-methyl-D-glucamine, and n-nonaynol-n-methyl-D-glucamine; esters, such as glycerin ester, sorbitan ester, methoxyacetic acid, ethoxyacetic acid, 3-ethoxypropionic acid, polyoxyethylene (hereinafter, referred to as POE) sorbitan fatty acid ester, POE glycol fatty acid ester, POE hexitan fatty acid ester, and alanine ethyl ester; ethers, such as polyethylene glycol, polypropylene glycol, polytetramethylene glycol, polyethylene glycol alkyl ether, polyethylene glycol alkenyl ether, alkyl polyethylene glycol, alkyl polyethylene glycol alkyl ether, alkyl polyethylene glycol alkenyl ether, alkenyl polyethylene glycol, alkenyl polyethylene glycol alkyl ether, alkenyl polyethylene glycol alkenyl ether, polypropylene glycol alkyl ether, polypropylene glycol alkenyl ether, alkyl polypropylene glycol, alkyl polypropylene glycol alkyl ether, alkyl polypropylene glycol alkenyl ether, alkenyl polypropylene glycol, alkenyl polypropylene glycol alkyl ether, alkenyl polypropylene glycol alkenyl ether, POE alkylene diglyceryl ether, POE alkyl ether, POE alkyl phenyl ether, and POE polypropylene alkyl ether; and a block/random copolymer of polyoxypropylene/polyoxyethylene.

Specific examples of the hydrolysis-suppressing compound having a nitrogen atom include water-soluble alkylamines, such as bishexamethylenetriamine (BHMT), tetramethylammonium hydroxide (TMAH), tetramethylamine (TMA), tetraethylamine (TEA), dimethylamine, trimethylamine, triethylamine, propylenediamine, methylamine, ethylamine, piperazine, and piperidine; amino alcohols, such as choline hydroxide (CH), triethanolamine, diethanolamine, and ethanolamine; and water-soluble amine compounds, such as ethylenediaminetetraacetic acid (EDTA), sodium diethyldithiocarbamate, and chitosan.

The content of the hydrolysis-suppressing compound in the polishing composition is preferably 10 ppm by mass or more, and more preferably 50 ppm by mass or more. As the hydrolysis-suppressing compound content increases, the polishing rate of the silicon material portion with the polishing composition is reduced.

The content of the hydrolysis-suppressing compound in the polishing composition is also preferably 100,000 ppm by mass or less, and more preferably 50,000 ppm by mass or less. As the hydrolysis-suppressing compound content decreases, the material cost of the polishing composition can be reduced, and additionally, the burden of treating the polishing composition after use in polishing, that is, the burden of waste liquid treatment can be reduced.

(pH Adjusting Agent)

Like the polishing composition of the first embodiment, the pH of the polishing composition of the second embodiment is preferably neutral, and more specifically within a range of 5 or more and 9 or less. When the pH is neutral, the polishing rate of the silicon material portion with the polishing composition is advantageously reduced.

A pH adjusting agent may be used to adjust the pH of the polishing composition of the second embodiment to a desired value. The pH adjusting agent to be used may be any of an acid and an alkali. The pH adjusting agent may be any of inorganic and organic compounds.

According to the second embodiment, the following advantages are obtained.

The hydrolysis-suppressing compound is used in the polishing composition of the second embodiment in order to reduce the polishing rate of the silicon material portion with the polishing composition. Therefore, the polishing composition has high polishing selectivity for the high-mobility material portion.

When the pH of the polishing composition is neutral, the polishing rate of the silicon material portion with the polishing composition is further reduced, which further improves the polishing selectivity of the polishing composition for the high-mobility material portion.

The embodiments described above may be modified as follows.

The polishing composition of each of the first and second embodiments may contain two or more types of abrasive grains. When the polishing composition of the first embodiment contains two or more types of abrasive grains, part of the abrasive grains does not need to necessarily have an average primary particle diameter of 40 nm or less.

The polishing composition of each of the first and second embodiments may contain two or more oxidizing agents.

The polishing composition of the second embodiment may contain two or more hydrolysis-suppressing compounds.

The polishing composition of the first embodiment may further contain a hydrolysis-suppressing compound. In this case, the polishing rate of the silicon material portion with the polishing composition is further reduced, which further improves the polishing selectivity of the polishing composition for the high-mobility material portion.

The polishing composition of each embodiment described above may further contain a known additive such as a preservative agent as required.

The polishing composition of each embodiment described above may be of a one-pack type or may be of a multi-pack type, such as a two-pack type.

The polishing composition of each embodiment described above may be prepared by diluting an undiluted solution of the polishing composition with water.

Next, examples of the present invention and comparative examples will be described.

Examples 101 to 117 and Comparative Examples 101 and 102

Polishing compositions of Examples 101 to 117 and Comparative Examples 101 and 102 were prepared by mixing colloidal silica and an oxidizing agent, and a hydrolysis-suppressing compound and a pH adjusting agent as required, with water. The details of the components in each of the polishing compositions and the results obtained by measuring the pH of each polishing composition are shown in Table 1.

TABLE 1

| | Colloidal silica | | | Oxidizing agent | | | Hydrolysis-suppressing compound | | |
| --- | --- | --- | --- | --- | --- | --- | --- | --- | --- |
| | Primary particle diameter [nm] | Secondary particle diameter [nm] | Content [% by mass] | Type | Standard electrode potential [V] | Content [mol/L] | Type | Content [ppm by mass] | pH |
| Example 101 | 12.0 | 25.2 | 1.0 | $H_2O_2$ | 1.7 | 1.00 | — | — | 7 |
| Example 102 | 25.0 | 39.3 | 1.0 | $H_2O_2$ | 1.7 | 1.00 | — | — | 11 |
| Example 103 | 33.3 | 64.3 | 1.0 | $H_2O_2$ | 1.7 | 1.00 | — | — | 7 |
| Example 104 | 33.3 | 64.3 | 1.0 | $H_2O_2$ | 1.7 | 1.00 | — | — | 11 |
| Example 105 | 33.3 | 64.3 | 1.0 | APS | 2 | 1.00 | — | — | 7 |
| Example 106 | 33.3 | 64.3 | 1.0 | Sodium dichloro-isocyanurate | 1.6 | 1.00 | — | — | 7 |
| Example 107 | 33.3 | 64.3 | 1.0 | $H_2O_2$ | 1.7 | 1.00 | Polyoxyethylene polyoxypropylene block polymer | 200 | 7 |
| Example 108 | 33.3 | 64.3 | 1.0 | $H_2O_2$ | 1.7 | 1.00 | Polyoxyethylene polyoxypropylene block polymer | 1000 | 7 |
| Example 109 | 33.3 | 64.3 | 1.0 | $H_2O_2$ | 1.7 | 1.00 | Polyoxyethylene polyoxypropylene block polymer | 5000 | 7 |
| Example 110 | 33.3 | 64.3 | 1.0 | $H_2O_2$ | 1.7 | 1.00 | Polyoxyethylene alkylene diglyceryl ether | 5000 | 7 |
| Example 111 | 33.3 | 64.3 | 1.0 | $H_2O_2$ | 1.7 | 1.00 | Polypropylene glycol | 5000 | 7 |
| Example 112 | 33.3 | 64.3 | 1.0 | $H_2O_2$ | 1.7 | 1.00 | Polyethylene glycol | 5000 | 7 |
| Example 113 | 33.3 | 64.3 | 1.0 | $H_2O_2$ | 1.7 | 1.00 | n-decanol-n-methyl-D-glucamine | 5000 | 7 |
| Example 114 | 90 | 211 | 1.0 | $H_2O_2$ | 1.7 | 1.00 | Polyoxyethylene polyoxypropylene block polymer | 5000 | 7 |
| Example 115 | 33.3 | 64.3 | 1.0 | $H_2O_2$ | 1.7 | 1.00 | Tetramethylammonium hydroxide | 100 | 7 |
| Example 116 | 33.3 | 64.3 | 1.0 | $H_2O_2$ | 1.7 | 1.00 | Trimethylamine | 100 | 7 |
| Example 117 | 33.3 | 64.3 | 1.0 | $H_2O_2$ | 1.7 | 1.00 | Triethanolamine | 100 | 7 |

TABLE 1-continued

| | Colloidal silica | | | Oxidizing agent | | | Hydrolysis-suppressing compound | | |
|---|---|---|---|---|---|---|---|---|---|
| | Primary particle diameter [nm] | Secondary particle diameter [nm] | Content [% by mass] | Type | Standard electrode potential [V] | Content [mol/L] | Type | Content [ppm by mass] | pH |
| Comparative Example 101 | 90 | 211 | 1.0 | $H_2O_2$ | 1.7 | 1.00 | — | — | 7 |
| Comparative Example 102 | — | — | — | $H_2O_2$ | 1.7 | 1.00 | Polyoxyethylene polyoxypropylene block polymer | 5000 | 7 |

In Table 1, "$H_2O_2$" represents hydrogen peroxide and "APS" represents ammonium persulfate. Acetic acid or potassium hydroxide was used as the pH adjusting agent.

The values of polishing rates obtained when the surfaces of a silicon germanium blanket wafer, germanium blanket wafer, and tetraethyl orthosilicate (TEOS) blanket wafer are polished under the conditions shown in Table 2 with each of the polishing compositions of Examples 101 to 117 and Comparative Examples 101 and 102 are shown in the columns entitled "polishing rate of SiGe", "polishing rate of Ge", and "polishing rate of TEOS", respectively, of Table 3. The value of the polishing rate of the TEOS blanket wafer was obtained by dividing by polishing time the difference between the thicknesses of the wafer before and after polishing measured using an optical interferometric film thickness measurement apparatus. The value of the polishing rate of the silicon germanium blanket wafer and the value of the polishing rate of the germanium were obtained by dividing by the density and polishing time the difference between the weights of each of the wafers before and after polishing. The value obtained by dividing the thus obtained polishing rate of silicon germanium with each of the polishing compositions of Examples 101 to 117 and Comparative Examples 101 and 102 by the thus obtained polishing rate of TEOS with the same polishing composition is shown in the column entitled "polishing rate of SiGe/polishing rate of TEOS" of Table 3. The value obtained by dividing the thus obtained polishing rate of germanium with each polishing composition by the thus obtained polishing rate of TEOS with the same polishing composition is shown in the column entitled "polishing rate of Ge/polishing rate of TEOS" of Table 3.

The acceptable level of the polishing rate of TEOS is 300 Å/min or less, more preferably 200 Å/min or less, and still more preferably 100 Å/min or less. The acceptable level of the value obtained by dividing the polishing rate of silicon germanium by the polishing rate of TEOS is 5 or more, more preferably 10 or more, and still more preferably 15 or more. The acceptable level of the value obtained by dividing the polishing rate of germanium by the polishing rate of TEOS is 10 or more.

TABLE 2

Apparatus: One-side CMP polisher
Polishing pad: Politex (trade name) manufactured by Rodel Incorporated
Polishing pressure: 100 g/cm$^2$
Rotational speed of platen: 50 rpm
Feeding rate of polishing composition: 100 mL/min

TABLE 3

| | Polishing rate of SiGe [Å/min] | Polishing rate of Ge [Å/min] | Polishing rate of TEOS [Å/min] | Polishing rate of SiGe/ polishing rate of TEOS | Polishing rate of Ge/ polishing rate of TEOS |
|---|---|---|---|---|---|
| Example 101 | 2010 | 3015 | 80 | 25.1 | 37.7 |
| Example 102 | 1420 | 2130 | 198 | 7.2 | 10.8 |
| Example 103 | 2091 | 3140 | 85 | 24.6 | 36.9 |
| Example 104 | 1550 | 2325 | 218 | 7.1 | 10.7 |
| Example 105 | 2400 | 3600 | 77 | 10.4 | 46.8 |
| Example 106 | 1650 | 2475 | 92 | 17.9 | 26.9 |
| Example 107 | 2374 | 3560 | 35 | 67.8 | 101.7 |
| Example 108 | 2306 | 3460 | 27 | 85.4 | 128.1 |
| Example 109 | 2242 | 3363 | 18 | 124.6 | 186.8 |
| Example 110 | 2354 | 3531 | 38 | 61.9 | 92.9 |
| Example 111 | 2302 | 3453 | 36 | 63.9 | 95.9 |
| Example 112 | 2378 | 3567 | 59 | 40.3 | 60.5 |
| Example 113 | 2520 | 3780 | 22 | 114.5 | 171.8 |
| Example 114 | 2620 | 3930 | 78 | 33.6 | 50.4 |
| Example 115 | 2428 | 3642 | 12 | 202.3 | 303.5 |
| Example 116 | 2380 | 3570 | 15 | 158.7 | 238.0 |
| Example 117 | 2250 | 3375 | 50 | 45.0 | 67.5 |
| Comparative Example 101 | 2560 | 3840 | 1620 | 1.6 | 2.4 |
| Comparative Example 102 | 88 | 132 | 18 | 4.9 | 7.3 |

As shown in Table 3, in the case of the polishing compositions of Examples 101 to 117, the value obtained by dividing the polishing rate of silicon germanium by the polishing rate of TEOS was 5 or more, or the value obtained by dividing the polishing rate of germanium by the polishing rate of TEOS was 10 or more. The obtained results are at a level that can be satisfactorily used for the purpose of selectively polishing the high-mobility material portion. Particularly, in Examples 101, 103, and 105 to 116, in which the pH is adjusted to 7, both the value obtained by dividing the polishing rate of silicon germanium by the polishing rate of TEOS and the value obtained by dividing the polishing rate of germanium by the polishing rate of TEOS were 10 or more, which is a particularly favorable result.

On the other hand, in the case of the polishing composition of Comparative Example 101, the value obtained by dividing the polishing rate of silicon germanium by the polishing rate of TEOS was less than 5 and was below the acceptable level. The obtained result is not at a level that can be satisfactorily used for the purpose of selectively polishing the high-mobility material portion.

Examples 201 to 216 and Comparative Example 201

Polishing compositions of Examples 201 to 216 and Comparative Example 201 were prepared by mixing colloidal silica and an oxidizing agent, and a hydrolysis-suppressing compound and a pH adjusting agent as required, with water. The details of the components in each of the polishing compositions and the results obtained by measuring the pH of each polishing composition are shown in Table 4.

In Table 4, "$H_2O_2$" represents hydrogen peroxide, "APS" represents ammonium persulfate, and "KOH" represents potassium hydroxide.

The values of polishing rates obtained when the surfaces of a gallium arsenide blanket wafer and tetraethyl orthosilicate (TEOS) blanket wafer are polished under the conditions shown in Table 5 with each of the polishing compositions of Examples 201 to 216 and Comparative Example 201 are shown in the columns entitled "polishing rate of GaAs" and "polishing rate of TEOS", respectively, of Table 6. The value of the polishing rate of the TEOS blanket wafer was obtained by dividing by polishing time the difference between the thicknesses of the wafer before and after polishing measured using an optical interferometric film thickness measurement apparatus. The value of the polishing rate of the gallium arsenide blanket wafer was obtained by dividing by the density and polishing time the difference between the weights of the wafer before and after polishing. The value obtained by dividing the thus obtained polishing rate of gallium arsenide with each of the polishing compositions of Examples 201 to 216 and Comparative Example 201 by the thus obtained polishing rate of TEOS with the same polishing composition is shown in the column entitled "polishing rate of GaAs/polishing rate of TEOS" of Table 6.

The acceptable level of the polishing rate of TEOS is 300 Å/min or less, more preferably 200 Å/min or less, and still more preferably 100 Å/min or less. The acceptable level of the value obtained by dividing the polishing rate of gallium arsenide by the polishing rate of TEOS is 5 or more, more preferably 10 or more, and still more preferably 15 or more.

TABLE 4

| | Colloidal silica | | | Oxidizing agent | | | Hydrolysis-suppressing compound | | Type of | |
|---|---|---|---|---|---|---|---|---|---|---|
| | Primary particle diameter [nm] | Secondary particle diameter [nm] | Content [% by mass] | Type | Standard electrode potential [V] | Content [mol/L] | Type | Content [ppm by mass] | pH adjusting agent | pH |
| Example 201 | 12 | 25.2 | 1 | $H_2O_2$ | 1.7 | 0.2 | — | — | — | 7 |
| Example 202 | 25 | 39.3 | 1 | $H_2O_2$ | 1.7 | 0.2 | — | — | KOH | 11 |
| Example 203 | 33.3 | 64.3 | 1 | $H_2O_2$ | 1.7 | 0.2 | — | — | — | 7 |
| Example 204 | 33.3 | 64.3 | 1 | $H_2O_2$ | 1.7 | 0.2 | — | — | KOH | 11 |
| Example 205 | 33.3 | 64.3 | 1 | APS | 2 | 0.2 | — | — | — | 7 |
| Example 206 | 33.3 | 64.3 | 1 | Sodium dichloro-isocyanurate | 1.6 | 0.2 | — | — | — | 7 |
| Example 207 | 33.3 | 64.3 | 1 | $H_2O_2$ | 1.7 | 0.2 | Polyoxyethylene polyoxypropylene block polymer | 200 | — | 7 |
| Example 208 | 33.3 | 64.3 | 1 | $H_2O_2$ | 1.7 | 0.2 | Polyoxyethylene polyoxypropylene block polymer | 1000 | — | 7 |
| Example 209 | 33.3 | 64.3 | 1 | $H_2O_2$ | 1.7 | 0.2 | Polyoxyethylene polyoxypropylene block polymer | 5000 | — | 7 |
| Example 210 | 33.3 | 64.3 | 1 | $H_2O_2$ | 1.7 | 0.2 | Polyoxyethylene alkylene diglyceryl ether | 5000 | — | 7 |
| Example 211 | 33.3 | 64.3 | 1 | $H_2O_2$ | 1.7 | 0.2 | Polypropylene glycol | 5000 | — | 7 |
| Example 212 | 33.3 | 64.3 | 1 | $H_2O_2$ | 1.7 | 0.2 | Polyethylene glycol | 5000 | — | 7 |
| Comparative Example 201 | 90 | 211 | 1 | $H_2O_2$ | 1.7 | 0.2 | — | — | — | 7 |
| Example 213 | 90 | 211 | 1 | $H_2O_2$ | 1.7 | 0.2 | Polyoxyethylene polyoxypropylene block polymer | 5000 | — | 7 |
| Example 214 | 33.3 | 64.3 | 1 | $H_2O_2$ | 1.7 | 0.2 | Tetramethylammonium hydroxide | 100 | — | 7 |
| Example 215 | 33.3 | 64.3 | 1 | $H_2O_2$ | 1.7 | 0.2 | Trimethylamine | 100 | — | 7 |
| Example 216 | 33.3 | 64.3 | 1 | $H_2O_2$ | 1.7 | 0.2 | Triethanolamine | 100 | — | 7 |

TABLE 5

Apparatus: One-side CMP polisher
Polishing pad: Politex (trade name) manufactured by Rodel Incorporated
Polishing pressure: 100 g/cm$^2$
Rotational speed of platen: 50 rpm
Feeding rate of polishing composition: 100 mL/min

TABLE 6

|  | Polishing rate of of GaAs [Å/min] | Polishing rate of TEOS [Å/min] | Polishing rate of GaAs/ polishing rate of TEOS |
|---|---|---|---|
| Example 201 | 723 | 36 | 20 |
| Example 202 | 3911 | 91 | 43 |
| Example 203 | 697 | 85 | 8 |
| Example 204 | 4134 | 258 | 16 |
| Example 205 | 1563 | 77 | 20 |
| Example 206 | 11818 | 92 | 128 |
| Example 207 | 687 | 76 | 9 |
| Example 208 | 653 | 32 | 21 |
| Example 209 | 621 | 8 | 81 |
| Example 210 | 677 | 38 | 18 |
| Example 211 | 651 | 36 | 18 |
| Example 212 | 689 | 59 | 12 |
| Comparative Example 201 | 615 | 243 | 3 |
| Example 213 | 548 | 23 | 24 |
| Example 214 | 714 | 42 | 17 |
| Example 215 | 690 | 39 | 18 |
| Example 216 | 752 | 50 | 15 |

As shown in Table 6, in the case of the polishing compositions of Examples 201 to 216, the polishing rate of TEOS was 100 Å/min or less, or the value obtained by dividing the polishing rate of gallium arsenide by the polishing rate of TEOS was 15 or more. The obtained results are at a level that can be satisfactorily used for the purpose of selectively polishing the high-mobility material portion.

On the other hand, in the case of the polishing composition of Comparative Example 201, the value obtained by dividing the polishing rate of gallium arsenide by the polishing rate of TEOS was below the acceptable level. The obtained result is not at a level that can be satisfactorily used for the purpose of selectively polishing the high-mobility material portion.

The invention claimed is:

1. A method for polishing, comprising:
providing an object including a portion containing a group III-V compound and a portion containing a silicon material; and
using a polishing composition to polish the object, wherein the polishing composition comprises:
abrasive grains;
an oxidizing agent; and
a hydrolysis-suppressing compound that bonds to a surface OH group of the portion containing a silicon material to function to suppress hydrolysis of the portion containing a silicon material.

2. The method according to claim 1, wherein the polishing composition has a neutral pH.

3. The method according to claim 1, wherein the hydrolysis-suppressing compound is selected from the group consisting of n-decanol-n-methyl-D-glucamine, n-octanoyl-n-methyl-D-glucamine, n-nonaynol-n-methyl-D-glucamine, glycerin ester, sorbitan ester, methoxyacetic acid, ethoxyacetic acid, 3-ethoxypropionic acid, polyoxyethylene sorbitan fatty acid ester, polyoxyethylene glycol fatty acid ester, polyoxyethylene hexitan fatty acid ester, alanine ethyl ester, polyethylene glycol, polypropylene glycol, polytetramethylene glycol, polyethylene glycol alkyl ether, polyethylene glycol alkenyl ether, alkyl polyethylene glycol, alkyl polyethylene glycol alkyl ether, alkyl polyethylene glycol alkenyl ether, alkenyl polyethylene glycol, alkenyl polyethylene glycol alkyl ether, alkenyl polyethylene glycol alkenyl ether, polypropylene glycol alkyl ether, polypropylene glycol alkenyl ether, alkyl polypropylene glycol, alkyl polypropylene glycol alkyl ether, alkyl polypropylene glycol alkenyl ether, alkenyl polypropylene glycol, alkenyl polypropylene glycol alkyl ether, alkenyl polypropylene glycol alkenyl ether, polyoxyethylene alkylene diglyceryl ether, polyoxyethylene alkyl ether, polyoxyethylene alkyl phenyl ether, polyoxyethylene polypropylene alkyl ether, a block/random copolymer of polyoxypropylene/polyoxyethylene, bishexamethylenetriamine, tetramethylammonium hydroxide, tetramethylamine, tetraethylamine, dimethylamine, trimethylamine, triethylamine, propylenediamine, methylamine, ethylamine, piperazine, piperidine, choline hydroxide, triethanolamine, diethanolamine, ethanolamine, ethylenediaminetetraacetic acid, sodium diethyldithiocarbamate, and chitosan.

4. The method according to claim 1, wherein the hydrolysis-suppressing compound is selected from the group consisting of a polyoxyethylene ester, polyethylene glycol and its derivative, and polypropylene glycol and its derivative.

5. The method according to claim 1, wherein the hydrolysis-suppressing compound is selected from the group consisting of polyoxyethylene polyoxypropylene block polymer, polyoxyethylene alkylene diglyceryl ether, polypropylene glycol, polyethylene glycol, n-decanol-n-methyl-D-glucamine, tetramethylammonium hydroxide, trimethylamine, and triethanolamine.

6. The method according to claim 1, wherein the hydrolysis-suppressing compound is contained in the polishing composition in an amount of 10 ppm by mass or more and 100,000 ppm by mass or less.

7. The method according to claim 1, wherein the group III-V compound is selected from the group consisting of gallium phosphide, indium phosphide, gallium arsenide, and indium antimonide.

8. The method according to claim 1, wherein the polishing composition has a pH range of 5 or more and 9 or less.

9. The method according to claim 1, wherein the hydrolysis-suppressing compound is selected from the group consisting of an alcohol, a phenol, a glycol, a glucamine, an ester, an ether, a block/random copolymer of polyoxypropylene/polyoxyethylene, a water-soluble alkylamine, an amino alcohol, and a water-soluble amine compound.

10. A method for polishing, comprising:
providing an object including a portion containing a group III-V compound and a portion containing a silicon material; and
using a polishing composition to polish the object, wherein the polishing composition comprises:
abrasive grains having an average primary particle diameter of 40 nm or less; and
an oxidizing agent.

11. The method according to claim 10, further comprising adding, prior to said using, to the polishing composition a hydrolysis-suppressing compound that bonds to a surface OH group of the portion containing a silicon material to function to suppress hydrolysis of the portion containing a silicon material.

12. The method according to claim 11, wherein the hydrolysis-suppressing compound is selected from the group consisting of an alcohol, a phenol, a glycol, a glucamine, an ester, and ether, a block/random copolymer of polyoxypropylene/polyoxyethylene, a water-soluble alkylamine, an amino alcohol, and a water-soluble amine compound.

13. The method according to claim 10, wherein the pH of the polishing composition is 5 or more and 7 or less.

14. The method according to claim 10, wherein the pH of the polishing composition is 7.

15. The method according to claim 10, wherein the abrasive grains are colloidal silica.

16. The method according to claim 15, wherein the abrasive grains have an average secondary particle diameter of 170 nm or less.

17. The method according to claim 10, wherein the group III-V compound is selected from the group consisting of gallium phosphide, indium phosphide, gallium arsenide, and indium antimonide.

18. The method according to claim 10, wherein the polishing composition has a neutral pH.

19. The method according to claim 10, wherein the polishing composition has a pH range of 5 or more and 9 or less.

* * * * *

UNITED STATES PATENT AND TRADEMARK OFFICE
CERTIFICATE OF CORRECTION

PATENT NO.        : 9,238,755 B2  
APPLICATION NO.   : 14/359269  
DATED             : January 19, 2016  
INVENTOR(S)       : Shuugo Yokota et al.

Page 1 of 1

It is certified that error appears in the above-identified patent and that said Letters Patent is hereby corrected as shown below:

On the Title page, item "[73] Assignee: Fujima Incorporated, Kiyosu-shi (JP)" should read:
"[73] Assignee: Fujimi Incorporated, Kiyosu-shi (JP)."

Signed and Sealed this  
Tenth Day of May, 2016

Michelle K. Lee  
*Director of the United States Patent and Trademark Office*